United States Patent [19]

Schmitt et al.

[11] 4,052,668

[45] Oct. 4, 1977

[54] ARRANGEMENT COMPRISING A HIGH VOLTAGE MEASURING CAPACITOR

[75] Inventors: Reinhold Schmitt; Hans-Joachim Freygang; Panajotis Margaris, all of Berlin, Germany

[73] Assignee: Siemens Aktiengesellschaft, Munich, Germany

[21] Appl. No.: 558,175

[22] Filed: Mar. 13, 1975

[30] Foreign Application Priority Data

Mar. 20, 1974 Germany .............................. 2413927

[51] Int. Cl.² ........................ G01R 15/04; G01R 5/00
[52] U.S. Cl. ................................. 324/126; 174/11 R; 324/105
[58] Field of Search ................... 324/126, 105, 61 QS, 324/61 R; 174/142, 143, 11 R, 11 BH, 14 R; 340/242

[56] References Cited

U.S. PATENT DOCUMENTS

| 2,269,584 | 1/1942 | Eldredge | 324/105 |
| 2,698,430 | 12/1954 | Chavigner | 340/242 |
| 3,515,988 | 6/1970 | Shawhan | 324/61 R |

FOREIGN PATENT DOCUMENTS

| 339,835 | 8/1921 | Germany | 324/126 |
| 1,058,890 | 2/1967 | United Kingdom | 324/126 |

Primary Examiner—Palmer C. Demeo
Assistant Examiner—Ernest F. Karlsen
Attorney, Agent, or Firm—Kenyon & Kenyon, Reilly, Carr & Chapin

[57] ABSTRACT

In an apparatus comprising a high-voltage measuring capacitor and, in particular, comprising a high-voltage measuring capacitor formed by a high-voltage conductor of a fully insulated, metal-encapsulated high-voltage switch-gear installation and by a surface electrode associated with the former, an auxiliary capacitor is associated with and located adjacent to said high-voltage capacitor. The auxiliary capacitor is part of an evaluation device which generates a signal corresponding to capacitance changes of the auxiliary capacitor resulting from external influences. Following the evaluation device is an indicating device for signaling the occurrence of such capacitance changes and/or a control or regulating device for compensating for capacitance changes of the high-voltage measuring capacitor caused by the same external influences.

6 Claims, 4 Drawing Figures

ARRANGEMENT COMPRISING A HIGH VOLTAGE MEASURING CAPACITOR

BACKGROUND OF THE INVENTION

1. Field of the Invention

The invention relates to an apparatus comprising a high-voltage measuring capacitor and, in particular, comprising a high-voltage capacitor formed by a high-voltage conductor of a fully insulated, metal-encapsulated high-voltage switch-gear installation and by a surface electrode associated with the former.

2. Description of the Prior Art

If high-voltage measurements are preformed with a high-voltage measuring capacitor of the aforesaid type, such as in an arrangement in which the latter is used with a low-voltage capacitor to form a capacitive voltage divider, the voltage measurements will have substantially no error only if the capacitance of the high-voltage measuring capacitor remains at a constant value. However, since such a high-voltage measuring capacitor is usually subjected to at least temperature variations and, moreover, since its dielectric exhibits a temperature dependence, the capacitance of the capacitor will usually vary, thereby causing errors of greater or lesser magnitude in the voltage measurements being derived therefrom.

It is therefore an object of the present invention to carry out such voltage measurements so as not to be influenced by the capacitance changes of the high-voltage measuring capacitor.

SUMMARY OF THE INVENTION

According to the present invention, the above and other objectives are achieved in an apparatus of the above-described type by associating with, and locating adjacent to, the high-voltage measuring capacitor of such apparatus, an auxiliary capacitor which forms part of an evaluating device for generating a signal corresponding to capacitance changes of the high-voltage capacitor resulting from external influences. Following the evaluating device is an indicating device for signaling the occurrence of such capacitance changes and/or a control or regulating device for the compensating for such changes. More particularly, with the present invention, capacitance changes of the high-voltage measuring capacitor can be signaled by signaling the capacitance changes of the auxiliary capacitor. In such case, the latter signaling can be used to interrupt the voltage measurement being taken and, thereby, to prevent inaccurate results. On the other hand, the capacitance changes of the auxiliary capacitor can be evaluated by a control or regulating device which functions to compensate for the capacitance changes of the high-voltage measuring capacitor. In this latter case, the high-voltage measurements can be continued in the presence of the disturbing external influences without any appreciable error. It is evident, therefore, that with the present invention the accuracy of the voltage measurements is not influenced by capacitance changes of the high-voltage measuring capacitor.

The auxiliary capacitor of the present invention need not in every case have a dielectric identical with the dielectric of the high-voltage measuring capacitor. Thus, if the dielectric of the auxiliary capacitor and of the high-voltage measuring capacitor differ from each other (e.g., they have different temperature and pressure characteristics), such differences can be taken into account by providing an appropriately designed control or regulating device.

However, since the aforesaid control or regulating device typically might include complex circuitry, it is advantageous for the dielectric of the auxiliary capacitor to have temperature and/or pressure characteristics identical to those of the high-voltage capacitor. Thus, for the sake of simplicity, an attempt should be made to use an auxiliary capacitor having the same dielectric as the one provided in the high-voltage measuring capacitor. In addition, the design of the auxiliary capacitor should expediently be such that its capacitance changes caused by thermal expansion are proportional to those of the high-voltage measuring capacitor.

If, the high-voltage capacitor of the present apparatus is used with a low-voltage capacitor to form a capacitive voltage divider and a trimming capacitor is associated in a known manner with the low-voltage capacitor, it is advantageous to connect the control or regulating device to the trimming capacitor. By doing so the capacitance changes of the trimming capacitor are made to vary as a function of the signal from the evaluating device. Such variation, in turn, compensates for the influence exerted by the capacitance changes of the high-voltage measuring capacitor on the divider ratio of the capacitive divider.

In other cases in which the high-voltage capacitor of the present apparatus is used with a low-voltage capacitor to form a capacitive voltage divider, it is advantageous to employ an amplifier circuit as the control or regulating device. More particularly, in such an arrangement, in order to equalize capacitance changes of the high-voltage measuring capacitor due to temperature or pressure variations, the amplifier circuit is connected to the evaluating device in such a manner that there results, as a function of the signal from the evaluating device, a gain increase or decrease at the amplifier output.

Particularly in those cases in which only the signaling of a capacitance change of the high-voltage measuring capacitor is desired, it is advantageous for the evaluating device to comprise an oscillator, the frequency-determining member of which is the auxiliary capacitor. In these situations, the frequency deviation of the oscillator from a nominal frequency represents a measure of the capacitance changes.

In other situations, it is believed particularly advantageous for the evaluating device to comprise a bridge circuit one of whose bridge arms is formed by the auxiliary capacitor and the other of whose arms are formed by additional capacitors. Additonally, one bridge diagonal is connected to an ac voltage and the other bridge diagonal to a difference amplifier, the output of which represents the signal of the evaluating device. Such output, in turn, can be utilized for signaling a capacity change as well as for compensating for such change.

DESCRIPTION OF THE DRAWING

A more thorough understanding of the above and other features of the present invention can be obtained from the following detailed description viewed in light of the accompanying drawings in which.

DETAILED DESCRIPTION

Figure 1:
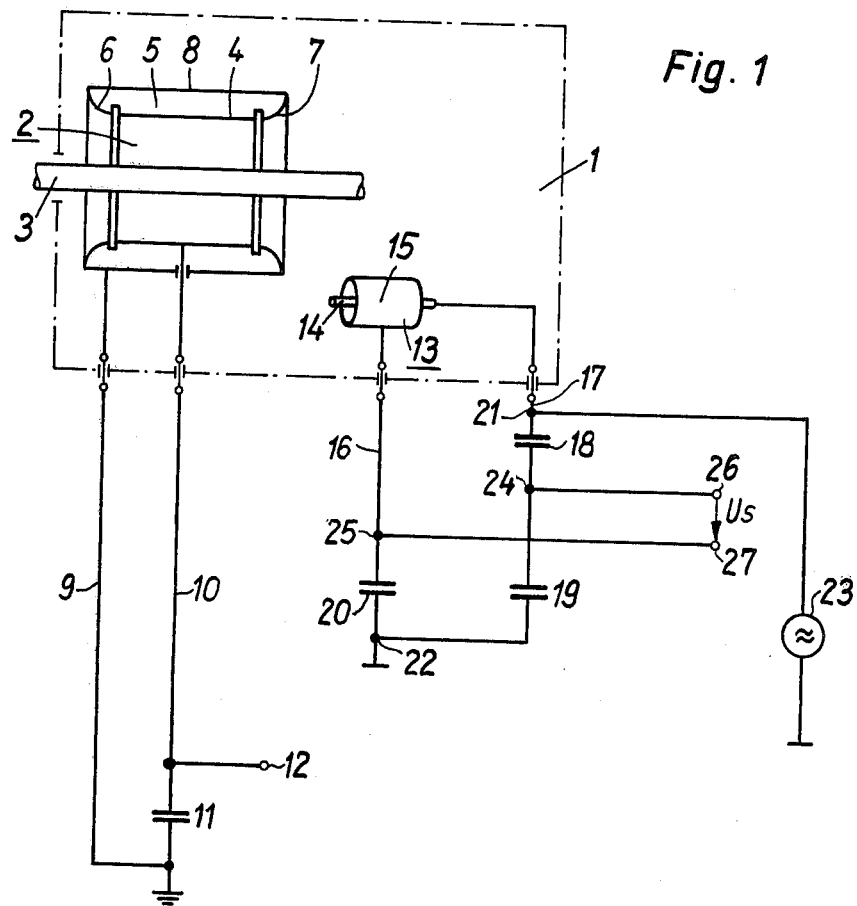
FIG. 1 shows an embodiment of the present invention in which means is provided for signaling the capacitance changes of a high-voltage measuring capacitor.

FIG. 1 shows schematically a gas space or chamber 1 in which is housed a high-voltage measuring capacitor 2. As shown, the latter capacitor comprises a conductor 3 which carries a high-voltage and which is enclosed in cylindrical electrode 4. The cylindrical electrode 4 may be mounted, for example, to a cast resin insulating part 5, the rounded faces of which each have a guard ring electrode 6 and 7, respectively. The cylindrical electrode 4 as well as the guard ring electrodes 6 and 7 may be formed by applying conductive coatings to the insulating part 5. The outside surface of the insulating part 5, additionally, supports another conductive coating which is grounded via a line 9. The insulating part 5 with the aforesaid conductive coatings may be accommodated in a tube section of a fully insulated, metal-encapsulated high-voltage switch-gear installation, the gas space 1 then being formed by the interior of such high-voltage switch-gear installation.

The cylindrical electrode 4 is connected via a line 10 to a low-voltage capacitor 11 which forms a capacitive voltage divider with the high-voltage measuring capacitor 2. A voltage proportional to the high-voltage can be taken from an output terminal 12, preferably after amplification.

In accord with the invention, an auxiliary capacitor 13 is disposed in the gas space 1 so as to be adjacent to the high-voltage measuring capcitor 2. The design of the auxiliary capacitor 13 is similar to that of the high-voltage measuring capacitor 2 in that it has an inner conductor 14 as one electrode and a cylindrical outer electrode as another electrode. Connecting lines 16 and 17, respectively, connect the auxiliary capacitor 13 to a bridge circuit which is at low-voltage potential and comprises, in addition to capacitor 13 in one bridge arm, additional capcitors 18, 19 and 20 in its additional bridge arms. The auxiliary capacitor 13 and the additional capacitors 18 to 20 are so arranged that the auxiliary capacitor 13 and the additional capacitor 20 are located in one bridge half and the other capacitors 18 and 19 in another bridge half. An ac voltage from an ac voltage source 23 is applied to one bridge diagonal formed by the circuit points 21 and 22. As will be explained hereinbelow, with the capacitor 13 so arranged and the ac signal so applied, a signal voltage Us indicative of the change in the capacitance of high-voltage capacitor 2 can be taken from across the terminals 26 and 27 of another diagonal formed by the bridge circuit points 24 and 25. The latter signal can then be utilized, for example, to produce a visual or acoustic signal in order to call an operator's attention to the change in capacitance.

More particularly, the appearance of a voltage at the terminals 26 and 27 of the bridge circuit indicates that the bridge equilibrium has been disturbed by a capacitance change of the auxiliary capacitor 13. But a change in the capacitance of the auxiliary capacitor 13 occurs only when there also occurs a change in temperature in the gas space 1, a change in the gas pressure in this chamber or a change of the gas mixture. In all of these cases, the high-voltage measuring capacitor 2 formed by the high-voltage conductor 3 and the cylindrical electrode 4 experiences a change in its capcity commensurate with the capacity change of the auxiliary capacitor 13. As a result, the voltage Us which arises due to the latter capacity change will be indicative of the former capacity change. Such voltage can, thus, be used to signal that the voltage measured at terminal 12 of the low-voltage capacitor 11 has become incorrect, due to the divider ratio being disturbed by the capacity change of capacitor 2. In Particular, by using the signal Us to generate a visual or acoustic signal, the appearance of the latter signal can be used to indicate that steps should be taken to compensate for the capacitance change of the high-voltage measuring capacitor.

Figure 2:
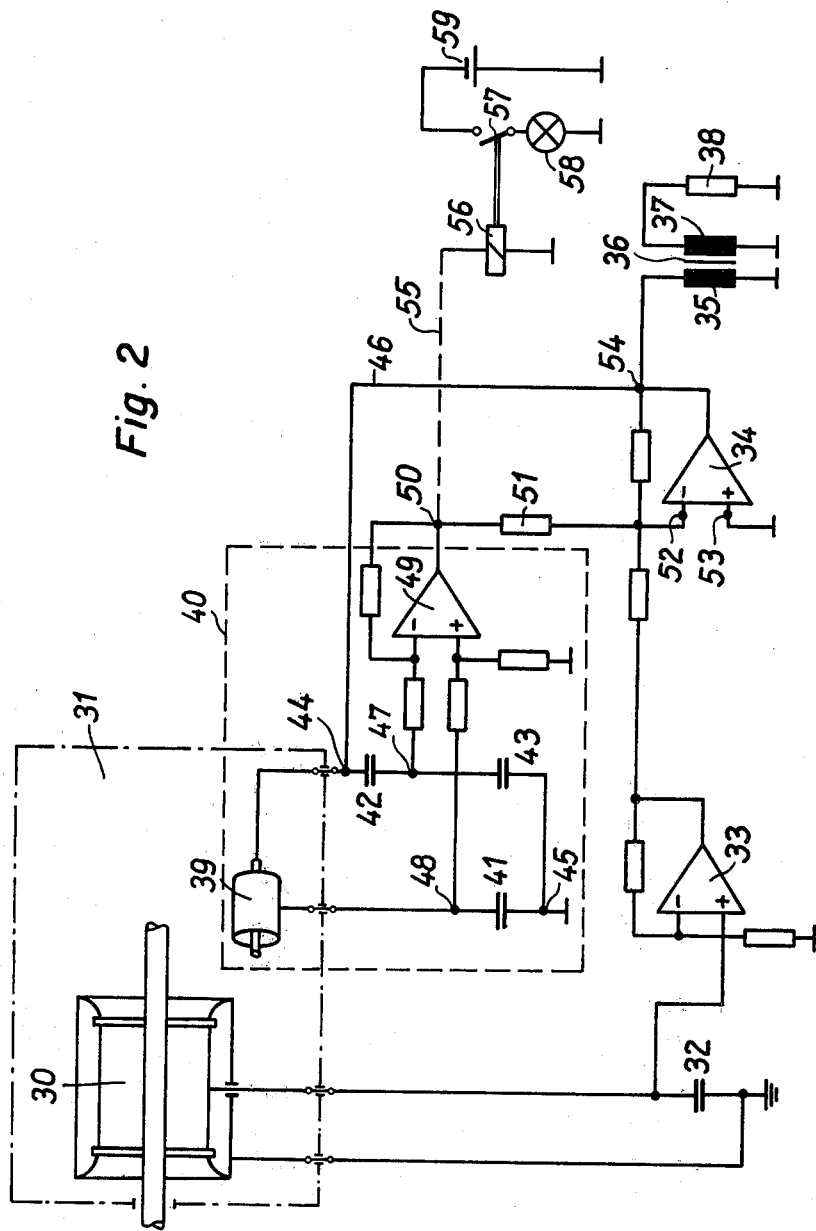
FIG. 2 illustrates an embodiment of the present invention in which means is provided for compensating for the influence of capacitance changes of a high-voltage measuring capacitor on a voltage measurement derived therefrom.

FIG. 2 shows an arrangement similar to that in FIG. 1 with the addition of means for compensating for the capacitance changes of high-voltage measuring capacitor. More specifically, a high-voltage measuring capacitor 30 similar to capacitor 2 of FIG. 1 is housed within a gas chamber 31. Connected to the high-voltage measuring capacitor 30 is a low voltage capacitor 32, both of which capacitors together forming a capacitive voltage divider. Connected to the low-voltage capacitor 32 is a preamplifier which is comprised of an operational amplifer 33 and is followed by a power amplifier 34 formed by another operational amplifier. Connected to the output of the power amplifier 34 is a primary winding 35 of an output transformer 36, to the secondary winding 37 of which is connected a load 38.

As in the embodiment of FIG. 1, disposed adjacent to the high-voltage measuring capacitor 30 in the gas chamber 31 is an auxiliary capacitor 39 of a design similar to that of the high-voltage measuring capacitor 30. As can be seen, the auxiliary capacitor 39 forms part of a bridge circuit of an evaluating device 40, and, in particular, is connected in series with another capacitor 41 in one bridge half. In the other bridge half of the bridge circuit are disposed the additional capacitors 42 and 43. The output voltage of the power amplifier 34 is connected across one diagonal formed by the circuit points 44, 45 of the bridge circuit via a connecting line 46. Connected to the other bridge diagonal 47, 48 of the bridge circuit is an operational amplifier designed as a difference amplifier 49. The output 50 of the difference amplifier 49 delivers an output whose magnitude is a measure of the amount of capacitance change of the auxiliary capacitor 39, and whose phase is a measure of the kind of capacitance change, i.e., whether the change is in a positive or in a negative direction relative to assumed starting or reference value. The output of the difference amplifier 49 is supplied, via a resistor 51, to one input 52 of the power amplifier 34, to which is also connected the output of the input amplifier 33. The other input 53 of the power amplifier 34 is grounded. Consequently, it can be shown that there appears at the output 54 of the power amplifier 34 and output quantity or voltage in which the capacitance changes of the auxiliary capacitor 39 and, hence, those of high voltage capacitor 30 are compensated for. Thus, such output voltage will be proportional to the voltage being measured by the high-voltage measuring capacitor 30, regardless of capacitance changes of such capacitor. As a result, in all cases, the voltage taken from the load 38 will be related to the high-voltage being measured by a constant transformation ratio.

As also shown in FIG. 2, a relay 56 may also be connected via connecting line 55 (shown as a broken line)

to the output 50 of the difference amplifier 49. In such case, the relay contact 57 causes a signal lamp 58 to light up by connecting the lamp to a battery 59, such connection being made by the relay upon the occurrence of a change in the capacitance of the high-voltage measuring capacitor 30.

Figure 3:
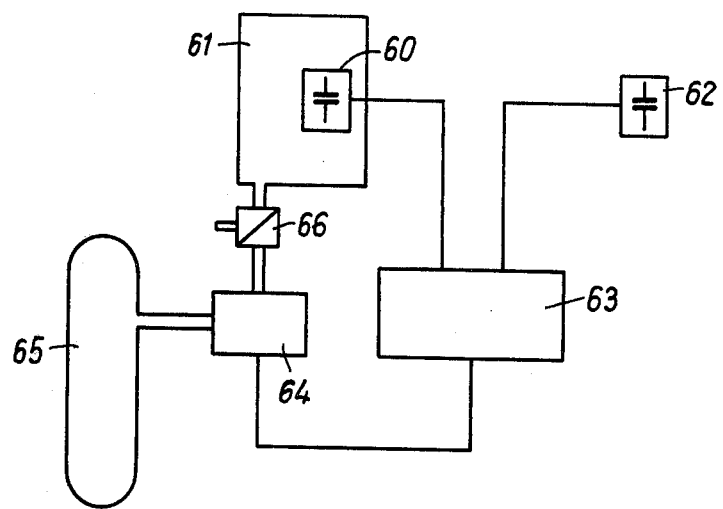
FIG. 3 shows an embodiment of the invention which employs an evaluating device which is connected to pressure control device.

In FIG. 3 an auxiliary capacitor 60 and an associated high-voltage measuring capacitor (not shown) are located in a gas chamber 61. Capacitance changes of the auxiliary capacitor 60 are compared with those of an additional capacitor 62 serving as a reference capacitor in a comparator or evaluating circuit 63. The latter device, in turn, is followed by an apparatus 64 which comprises a pump and compressor. Apparatus 64 pumps gas from a reservoir 65 into the gas chamber 61 as needed, thereby compensating from the changes in the capacitance of capacitor 60 and, thus, its associated high-voltage capacitor. Additionally, the pressure in the gas chamber 61 is controlled to a maximum permissible value, from a measuring point of view, by means of a pressure monitor 66.

Figure 4:
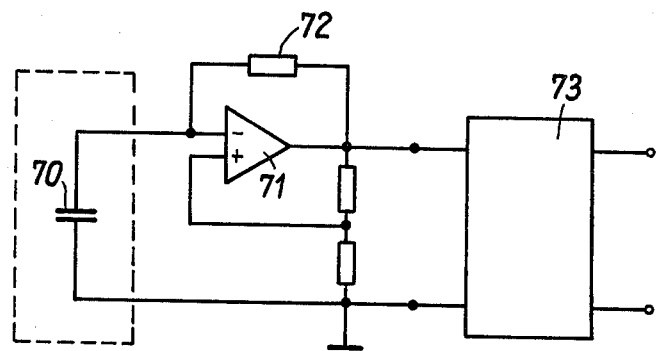
FIG. 4 illustrates an embodiment of the invention which employs an evaluating device which is connected to an oscillator.

FIG. 4 shows an oscillator which is adapted for use as an evaluating device and has a frequency-determining member which is an auxiliary capacitor 70. In particular, the capacitor 70 forms with an operational amplifier 71 and a resistor 72 and RC oscillator. The oscillator is followed by a filter 73 turned to a nominal frequency so that a voltage appears at the output of the filter only when the capacitance of the auxiliary capacitor 70 and, hence, that of the high voltage measuring capacitor 30 associated therewith changes. This signal may be fed, for example, to a reporting device in the manner shown in FIG. 2 for signaling a change in the capacity of the high-voltage capacitor.

What is claimed is:

1. Apparatus for measuring voltage in a high-voltage conductor of a fully insulated, metal-encapsulated high voltage-switching installation wherein condition changes such as changes in pressure, temperature or the like can occur during the operation thereof, comprising:
   a surface electrode disposed adjacent said high-voltage conductor, said surface electrode and said high-voltage conductor cojointly defining a high-voltage measuring capacitor for detecting the voltage on said conductor, said measuring capacitor being susceptible to capacitance variations because of said condition changes in said installation;
   an auxiliary capacitor disposed within said high-voltage installation in the vicinity of said measuring capacitor and likewise susceptible to capacitance variations in response to said condition changes;
   evaluation circuit means incorporating said auxiliary capacitor for detecting variations in the capacitance of said auxiliary capacitor caused by said condition changes and for generating a signal indicative of said capacitance variations of said auxiliary capacitor thereby providing an indication that the capacitance of said measuring capacitor has likewise undergone a variation because of said condition changes;
   and compensating means responsive to said signal for varying the capacitance of said high voltage capacitor to compensate for the changes in capacitance of said high voltage capacitor caused by said condition changes.

2. Apparatus in accordance with claim 1 in which: said high-voltage capacitor has a dielectric formed by gas; and said compensating means includes a pressure control device for varying the pressure of said gas.

3. Apparatus for measuring voltage on a high-voltage conductor of a fully insulated, metal-encapsulated high-voltage switching installation wherein condition changes such as changes in pressure, temperature or the like can occur during the operation thereof; comprising:
   a surface electrode disposed adjacent said high-voltage conductor, said surface electrode and said high-voltage conductor cojointly defining a high-voltage measuring capacitor for detecting the voltage on said conductor, said measuring capacitor being susceptible to capacitance variations because of said condition changes in said installation;
   an auxiliary capacitor disposed within said high-voltage installation in the vicinity of said measuring capacitor and likewise susceptible to capacitance variations in response to said condition changes;
   evaluation circuit means incorporating said auxiliary capacitor for detecting variations in the capacitance of said auxiliary capacitor caused by said condition changes and for generating a signal indicative of said capacitance variations of said auxiliary capacitor thereby providing an indication that the capacitance of said measuring capacitor has likewise undergone a variation because of said condition changes;
   a low-voltage capacitor, said low-voltage capacitor being so arranged as to form a capacitive voltage divider with said high-voltage capacitor;
   and compensating means including a trimming capacitor which changes capacitance as a function of said signal and is so arranged relative to said low-voltage capacitor as to compensate for the changes in the divider ratio of said capacitive voltage divider resulting from changes in capacitance of said high-voltage capacitor.

4. Apparatus for measuring voltage on a high-voltage conductor of a fully insulated, metal-encapsulated high voltage-switching installation wherein condition changes such as changes in pressure, temperature or the like can occur during the operation thereof, comprising:
   a surface electrode disposed adjacent said high-voltage conductor, said surface electrode and said high-voltage conductor cojointly defining a high-voltage measuring capacitor for detecting the voltage on said conductor, said measuring capacitor being susceptible to capacitance variations because of said condition changes in said installation;
   an auxiliary capacitor disposed within said high-voltage installation in the vicinity of said measuring capacitor and likewise susceptible to capacitance variations in response to said condition changes;
   evaluation circuit means incorporating said auxiliary capacitor for detecting variations in the capacitance of said auxiliary capacitor caused by said condition changes and for generating a signal indicative of said capacitance variations of said auxiliary capcitor thereby providing an indication that the capacitance of said measuring capacitor has likewise undergone a variation because of said condition changes;
   a low-voltage capacitor, said low-voltage capacitor being so arranged as to form a capacitive voltage divider with said high voltage capacitor;
   and compensation means including an amplifier circuit which is connected to said low-voltage capacitor and to said evaluation circuit, said amplifier circuit being so arranged as to undergo changes in gain which compensate for changes in output caused by changes in the capacitance of said high-voltage capacitor.

5. Apparatus in accordance with claim 1 in which said evaluation circuit further includes:

an oscillator whose frequency determining member includes said auxiliary capacitor and whose frequency deviations from a nominal frequency are indicative of the changes in capacitance of said high-voltage capacitor.

6. Apparatus in accordance with claim 1 in which said evaluation circuit further includes:

a difference amplifier whose output comprises said signal;

and a bridge circuit having one bridge arm which includes said auxiliary capacitor and additional bridge arms which include additional capacitor, one bridge diagonal of said bridge circuit being adapted to be responsive to an ac voltage and the other bridge diagonal of said bridge circuit being adapted to be connected to said amplifier.

* * * * *